United States Patent [19]

Ueda

[11] 4,266,236
[45] May 5, 1981

[54] TRANSISTOR HAVING EMITTER RESISTORS FOR STABILIZATION AT HIGH POWER OPERATION

[75] Inventor: Kazuyoshi Ueda, Tokyo, Japan

[73] Assignee: Nippon Electric Co., Ltd., Tokyo, Japan

[21] Appl. No.: 32,821

[22] Filed: Apr. 24, 1979

[30] Foreign Application Priority Data

Apr. 24, 1978 [JP] Japan .................................. 53-48950

[51] Int. Cl.³ .......................................... H01L 29/72
[52] U.S. Cl. ...................................... 357/34; 357/28; 357/36; 357/51; 357/86
[58] Field of Search .................... 357/36, 28, 86, 34, 357/68, 51

[56] References Cited

U.S. PATENT DOCUMENTS

| | | | |
|---|---|---|---|
| 3,358,197 | 12/1967 | Scarlett | 357/36 |
| 3,519,898 | 7/1970 | Natani | 357/36 |
| 3,619,741 | 11/1971 | Morgan et al. | 357/28 |
| 3,740,621 | 6/1973 | Carley | 357/36 |
| 3,769,561 | 10/1973 | White et al. | 357/36 |
| 3,801,886 | 4/1974 | Imaizumi et al. | 357/86 |
| 3,858,234 | 12/1974 | Olson | 357/86 |
| 3,893,154 | 7/1975 | Mroczek et al. | 357/36 |
| 3,918,080 | 11/1975 | Kerr | 357/36 |
| 3,936,863 | 2/1976 | Olmstead | 357/36 |

Primary Examiner—William D. Larkins
Attorney, Agent, or Firm—Sughrue, Rothwell, Mion, Zinn and Macpeak

[57] ABSTRACT

A technique of increasing the safe operating area of a power transistor is disclosed which comprises the addition of a resistive region of a conductivity (P or N) opposite that of the emitter conductivity, the resistive region located between the emitter region and the emitter electrode so as to prevent local thermal runaway of the emitter current and the concomitant secondary breakdown of the transistor. A conducting electrode connects the emitter region to the resistive region to thereby short-circuit the resistive-emitter region junction.

5 Claims, 10 Drawing Figures

A

B

C

D

E

TRANSISTOR HAVING EMITTER RESISTORS FOR STABILIZATION AT HIGH POWER OPERATION

The present invention relates to a transistor structure, and more particularly to a power transistor structure having an enlarged "safe operating area". The term "safe operating area" means regions of collector current and collector-emitter voltage of a transistor within which the transistor can safely operate without any fear of destruction.

Generally a power transistor has a shortcoming that its safe operating area is limited by an undesirable phenomenon know as secondary breakdown. The term "secondary breakdown" as used herein means the phenomenon that the emitter current of a transistor is concentrated at a local region of the emitter, resulting in local heating of the transistor and eventually in local thermal runaway and breakdown of the transistor. If a transistor is operated so as to produce large electric power consumption, the transistor becomes thermally unstable. Assuming that part of an emitter region has taken a higher temperature than the other part, then the emitter current flowing through the higher temperature part increases, and thermal positive feedback is produced at that part such that the temperature at that part is raised further, with the result of breakdown of the transistor.

Conventional power transistors adopt the following measures for preventing secondary breakdown and enlarging the safe operating area:

1. The emitter region is broadened to reduce current density of emitter current;
2. The base width is widened to make heat generated in the collector hardly attainable to the emitter;
3. Resistance of the collector layer is increased to increase collector resistance $r_c$ and thereby to limit the emitter current; and
4. Materials and package structure are used having large heat dissipation.

However, these measures cause degradation of performance of a transistor such as deterioration in high frequency operation and increase in operating resistance or increase cost of transistor production, though they may contribute to enlarging the safe operating area. Consequently, the above-mentioned measures have not been appropriate to practically enlarge the safe operating area to a considerable extent.

A transistor structure having an enlarged safe operating area in which a resistive component of an emitter region between an active region and an emitter electrode lead-out region is used as an emitter resistance, is disclosed in U.S. Pat. No. 3,358,197 granted to R. M. Scarlett. However, in such a structure, the emitter region in the proximity of the emitter electrode lead-out region performs an emitter operation as well, although the carrier injection efficiency is smaller than that of the active region, so that if the emitter current in this portion is increased, breakdown of the transistor results due to thermal positive feedback.

Therefore, it is an object of the present invention to provide a semiconductor device in which the local thermal runaway of an emitter current at a part of an emitter region which causes secondary breakdown of a transistor is prevented and the safe operating area enlarged.

According to the present invention, there is provided a semiconductor device in which within an emitter region of one conductivity type is formed an additional region of the other conductivity type and an emitter electrode is led out via a resistive component of this additional region. At least one electrode is further connected to the additional region apart from the emitter electrode so as to form the resistance component therebetween. This electrode is also connected to the emitter region and favorably shortcircuits a p-n junction between the emitter and additional regions.

According to the present invention, a resistive component formed in the additional regional region intervenes between the emitter electrode and the emitter active region, so that a voltage drop across this resistive component becomes large and limits the increase in an emitter current even if a large emitter current should flow locally. Accordingly, an abnormal increase in the current through a part of the emitter region can be prevented, and thermal breakdown of a transistor due to increase in a local emitter current can be avoided. Therefore, the safe operating area of a transistor can be enlarged. Furthermore, according to the present invention, the resistive component is formed of a region of different conductivity type from the emitter region, so that there exists no current path without an intervening resistor between the emitter electrode and the active emitter region, and hence wherever in the emitter region the increase of the emitter current may arise, the current limiting operation can be effectively achieved by the resistance component.

The above and other objects and features of the invention will become more apparent from the following description taken in conjunction with the accompanying drawings, wherein.

Figure 3:
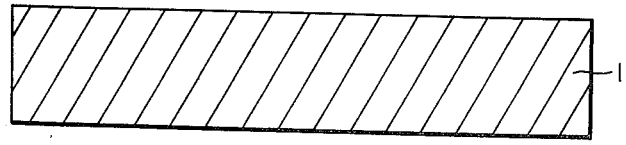
Figure 3:
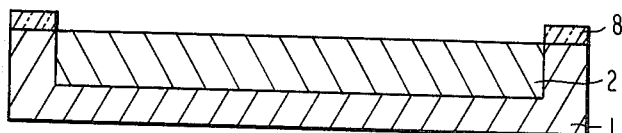
Figure 3:
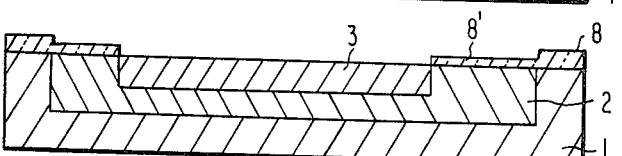
Figure 3:
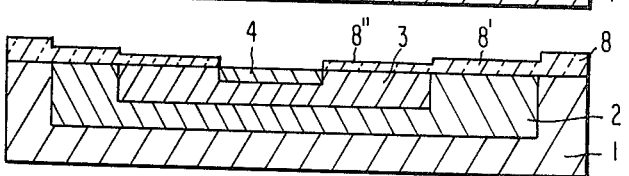
Figure 3:
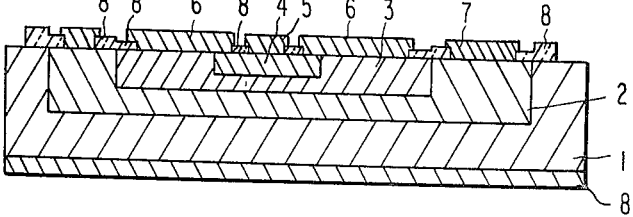
Figure 4:
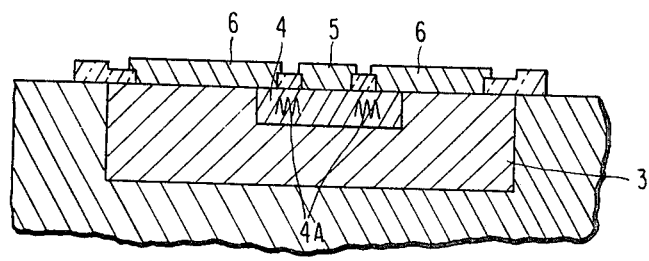
Figure 5:
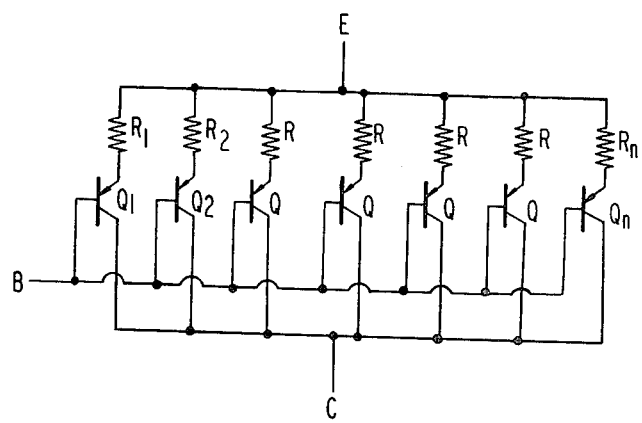
Figure 6:
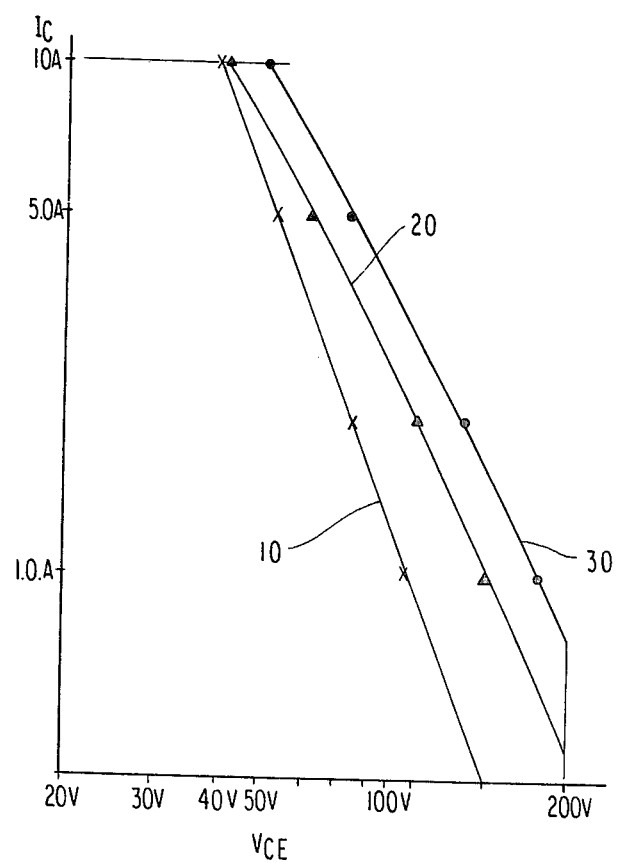

FIG. 3(a) through 3(e) are cross-section views showing successive steps in a manufacturing process of a power transistor according to one preferred embodiment of the present invention;

FIG. 4 is an enlarged cross-section view showing a principal part of FIG. 3(e);

FIG. 5 is an equivalent circuit diagram of a power transistor according to one preferred embodiment of the present invention; and FIG. 6 is a graph showing a relation between a collector current and a collector-emitter voltage for illustrating safe operating areas of the transistors according to the prior art and this invention.

Figure 1:
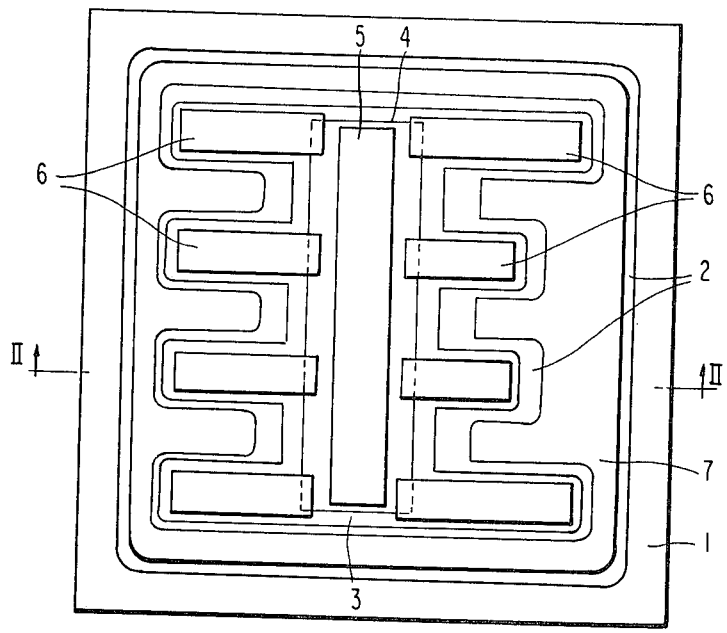
FIG. 1 is a plan view of a power transistor according to one preferred embodiment of the present invention.
Figure 2:
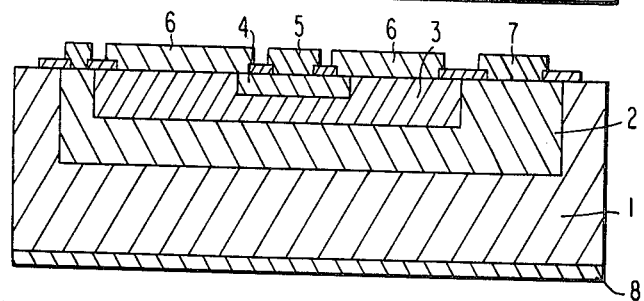
FIG. 2 is a cross-section view taken along line II—II in FIG. 1.

Referring now to FIGS. 1 and 2 of the drawings, a power transistor according to one preferred embodiment of the present invention comprises a collector region 1 of one conductivity type (P-type or N-type), a base region 2 of the other conductivity type (N-type or P-type) formed in the collector region 1, an emitter region 3 of the one conductivity type formed in the base region 2, and a resistance region 4 of the other conductivity type provided in this emitter region 3. The emitter region 3 is formed so as to extend in a comb shape from a center line of a semiconductor chip in the opposite directions. The resistance region 4 is located at the central area of the emitter region 3. On the central area of the resistance region 4 is deposited a metallic electrode layer 5. A p-n junction between this resistance region 4 and the emitter region 3 is short-circuited by metallic electrode layers 6 which make contact with these regions 3 and 4 and are separated from the metallic electrode layer 5 and extended along the teeth of the comb of the emitter region 3. A metallic electrode layer 7 is connected to the upper surface of the base region 2 as a base electrode, and a collector electrode 8 is deposited on the back surface of the collector region 1.

Now the successive steps in the manufacturing process of the power transistor according to the above-described preferred embodiment will be described in more detail with reference to FIGS. 3(a) to 3(e). In the following, description is made, by way of example, of the case of an NPN transistor. At first, as shown in FIG. 3(a), an N-type silicon substrate/having an impurity concentration of $10^{15-16} cm^{-3}$ is prepared which will serve as a collector region. In this silicon substrate 1, is formed a base region 2 of P-type conductivity having an impurity concentration of $10^{17-18} cm^{-3}$ by diffusion to a depth of 15μ though a silicone dioxide diffusion mask 8 as shown in FIG. 3(b). Thereafter, within the base region 2 is formed an emitter region 3 of N-type conductivity having an impurity concentration of $10^{20} cm^{-3}$ by diffusion to a depth of about 8-9μ through a silicon dioxide diffusion mask 8' as shown in FIG. 3(c), and furthermore within the emitter region 3 is formed a resistance region 4 of P-type condutivity having an impurity concentration of greater than $10^{20} cm^{-3}$ by diffusion to a depth of 3μ through a diffusion mask 8'' as shown in FIG. 3(d).

Subsequently, apertures are opened in the silicon dioxide layers 8,8',8'' and 8''' on the upper surface of the silicon substrate and a metallic layer is deposited and patterned to form metallic electrodes 5, 6 and 7 as shown in FIG. 3(e). The metallic electrode layer 5 is formed on the resistance region 4 and serves as a common emitter terminal to be electrically connected to an external circuit. A plurality of metallic electrodes 6 are formed with a distance from the metallic electrode layer 5 and that they bridge a P-N junction between the regions 3 and 4 by being electrically connected to the emitter region 3 and a peripheral part of the resistance region 4. The metallic electrode layer 7 is electrically connected to the base region 2. The distance between the metallic electrode layers 5 and 6 is so selected that the resistance of a part of the resistance region 4 between these two electrodes may take a predetermined value in a range of 0.03Ω to 0.2Ω. Thereafter, on the back surface of the N-type silicon substrate 1 is deposited a metallic electrode 8 serving as a collector electrode. With respect to the collector electrode, it is also possible that the silicon substrate 1 is directly mounted by means of a solder on conductive portion of a package and that the conductive portion is used as a collector electrode.

In a transistor having the aforementioned construction, as will be seen from FIG. 4 which shows the emitter portion in an enlarged scale, each part 4A of the resistance region 4 between the metallic electrodes 5 and 6 functions as an emitter resistor. The transistor according to such preferred embodiment is equivalent to the circuit shown in FIG. 5 in which a collector terminal C, a base terminal B and an emitter terminal E corresponds respectively to the collector electrode 8, the base electrode 7 and the common terminal 5 in FIG. 3(e). Emitter resistors $R_1, R_2, \ldots R_n$ by the parts 4A are connected to respective emitters of component transistors $Q_1, Q_2, \ldots Q_n$ and commonly led out to an emitter terminal E, and furthermore, the respective series connections of the emitter resistors and the component transistors $Q_1, Q_2 \ldots Q_n$ can be deemed to be connected in parallel to each other. Accordingly, even if an emitter region in a certain component transistor should take a higher temperature than the emitter regions of the other component transistors and a large current should flow through that emitter region, the voltage drop across the corresponding emitter resistor rises by the increased emitter current flowing through the emitter region, and thereby excessive increase in the emitter current can be suppressed. As a result, local thermal runaway of an emitter current that is a cause of secondary breakdown can be prevented, and the safe operating area of a transistor can be greatly enlarged.

Furthermore, since the junction between the resistance region 4 and the emitter region 3 is backwardly biased under an operating condition, the emitter terminal 5 can be connected to the emitter region 3 only through the resistance region 4 and the metallic electrode layer 6, and hence all the electrical paths from the emitter terminal 5 to the emitter region 3 provide emitter respectively. Consequently, in whatever local portion of the emitter region 3 a large emitter current may arise, excessive increase in the emitter current can be effectively suppressed by means of the emitter resistor R. This means an increase in safe operating area.

Referring to FIG. 6, the transistor according to the above-mentioned embodiment of this invention has a maximum collector current of 10A and a maximum collector-emitter voltage of 200V and also has a safe operating area determined by a line 30, that is, a range on the collector current Ic vs. collector-emitter voltage $V_{CE}$ characteristics encircled by the line 30, a line of $V_{CE}=200V$, a line of $V_{CE}=0V$, a line of Ic=10A and a line of Ic=0A. Prior art transistors which have the same base and emitter dimensions and the same base, emitter and collector impurity concentrations as those of the transistor of the embodiment and have emitter resistors as a resistance component in an emitter region and no emitter resistor in an emitter region, respectively, show limited safe operating areas determined respectively by a line 20 (for a transistor only with emitter resistor) and by a line 10 (for a transistor without emitter resistor).

According to the present invention, the resistance of the emitter resistor can be arbitrarily preset by changing various factors such as the depth and impurity concentration of the resistance region 4 and the distance between the metallic electrode layers 5 and 6. The depth of the resistance region 4 is chosen at such a depth that the electrical performance of the emitter region 3 may not be deteriorated, that is, in the range of 2-5μ, and the impurity concentration of the resistance region 4 is of the same order as the impurity concentration of the emitter region 3, but the former is chosen slightly richer than the latter, i.e., at greater than $10^{20} cm^{-3}$. The resistance of the emitter resistor is to be varied depending upon the use and electrical characteristics of the transistor, but it is generally chosen in the range of 0.03-0.2Ω. If the resistance is too high, the gain of the transistor is lowered.

While a transistor of the so-called planar structure has been described and illustrated in the aforementioned preferred embodiment, the present invention is equally applicable to a power transistor of the mesa structure. In addition, by dividing an emitter into a plurality of regions and forming a resistance region of the present invention in each emitter region, the transistor can be made operable at higher frequencies and at a higher output power.

What is claimed is:

1. A semiconductor device comprising a collector region of one conductivity type, a base region of the other conductivity type making contact with said collector region, an emitter region of said one conductivity type making contact with said base region and separated from said collector region, an additional region of said other conductivity type having its pheriphery surrounded by said emitter region, an emitter electrode electrically connected to said additional region, and at least one additional electrode separated from said emitter electrode and electrically short-circuiting said emitter region and said additional region.

2. A semiconductor device as claimed in claim 1, wherein said collector region, said base region, said emitter region and said additional region are formed in a semiconductor substrate having a major surface, said base region, said emitter region and said additional region reaching said major surface, and said emitter electrode and said additional electrode being formed on said major surface.

3. A semiconductor device claimed in claim 2, further comprising a base electrode connected to said base region at said major surface and a collector electrode attached to said collector region at a surface of said substrate which is opposite to said major surface.

4. A semiconductor device in claims 1 or 2, wherein a portion of said additional region between said emitter electrodes and said additional electrode has a resistance of 0.03 to 0.2 ohms.

5. A semiconductor device comprising a first region of one conductivity type, a second region of the other conductivity type formed in said first region, a third region of said one conductivity type formed in said second region, a fourth region of said other conductivity type formed in said third region, a first means coupled to said fourth region for leading out a common terminal, a second means coupled to said third and fourth regions for shortcircuitting therebetween, a third means coupled to said second region for leading out a control terminal, and a fourth means coupled to said first region for leading out an output terminal.

* * * * *

REEXAMINATION CERTIFICATE (127th)

United States Patent [19]

Ueda

[11] B1 4,266,236

[45] Certificate Issued Oct. 11, 1983

[54] TRANSISTOR HAVING EMITTER RESISTORS FOR STABILIZATION AT HIGH POWER OPERATION

[75] Inventor: Kazuyoshi Ueda, Tokyo, Japan

[73] Assignee: Nippon Electric Co., Ltd., Tokyo, Japan

Reexamination Request:
No. 90/000,285, Nov. 8, 1982

Reexamination Certificate for:
Patent No.: 4,266,236
Issued: May 5, 1981
Appl. No.: 32,821
Filed: Apr. 24, 1979

[30] Foreign Application Priority Data

Apr. 24, 1978 [JP] Japan .................... 53-48950

[51] Int. Cl.$^3$ ............................ H01L 29/72
[52] U.S. Cl. ......................... 357/34; 357/28; 357/36; 357/51; 357/86

[58] Field of Search ........................... 357/36

[56] References Cited

U.S. PATENT DOCUMENTS

3,918,080  11/1975  Kerr ..................... 357/36

FOREIGN PATENT DOCUMENTS

51-34209  8/1976  Japan ..................... 357/36

*Primary Examiner*—William D. Larkins

[57] ABSTRACT

A technique of increasing the safe operating area of a power transistor is disclosed which comprises the addition of a resistive region of a conductivity (P or N) opposite that of the emitter conductivity, the resistive region located between the emitter region and the emitter electrode so as to prevent local thermal runaway of the emitter current and the concomitant secondary breakdown of the transistor. A conducting electrode connects the emitter region to the resistive region to thereby short-circuit the resistive-emitter region junction.

REEXAMINATION CERTIFICATE ISSUED UNDER 35 U.S.C. 307.

TRANSISTOR HAVING EMITTER RESISTORS FOR STABILIZATION AT HIGH POWER OPERATION

THE PATENT IS HEREBY AMENDED AS INDICATED BELOW.

AS A RESULT OF REEXAMINATION, IT AS BEEN DETERMINED THAT:

Claims 1-5 having been finally determined to be unpatentable, are cancelled.

* * * * *